United States Patent
Nguyen et al.

(10) Patent No.: US 10,347,473 B2
(45) Date of Patent: Jul. 9, 2019

(54) SYNTHESIS OF HIGH-PURITY BULK COPPER INDIUM GALLIUM SELENIDE MATERIALS

(75) Inventors: Vinh Q Nguyen, Fairfax, VA (US); Jesse A. Frantz, Landover, MD (US); Jasbinder S. Sanghera, Ashburn, VA (US); Ishwar D. Aggarwal, Fairfax Station, VA (US); Allan J. Bruce, Scotch Plains, NJ (US); Michael Cyrus, Summit, NJ (US); Sergey V. Frolov, New Providence, NJ (US)

(73) Assignees: The United States of America, as represented by the Secretary of the Navy, Washington, DC (US); Sunlight Photonics Inc., South Plainfield, NJ (US)

( * ) Notice: Subject to any disclaimer, the term of this patent is extended or adjusted under 35 U.S.C. 154(b) by 561 days.

(21) Appl. No.: 12/884,586

(22) Filed: Sep. 17, 2010

(65) Prior Publication Data

US 2011/0067997 A1 Mar. 24, 2011

Related U.S. Application Data

(60) Provisional application No. 61/245,402, filed on Sep. 24, 2009, provisional application No. 61/245,400, filed on Sep. 24, 2009.

(51) Int. Cl.
*H01L 21/02* (2006.01)
*H01L 31/18* (2006.01)
(Continued)

(52) U.S. Cl.
CPC ...... *H01J 37/3429* (2013.01); *C23C 14/0623* (2013.01); *C23C 14/087* (2013.01);
(Continued)

(58) Field of Classification Search
CPC ................ H01L 31/18; H01L 31/0368; H01L 31/03923; H01L 21/02568;
(Continued)

(56) References Cited

U.S. PATENT DOCUMENTS 3,767,471 A * 10/1973 Kasper .................... H01L 21/00
148/33
3,932,291 A * 1/1976 Donohue ................. C01G 3/00
252/62.3 V
(Continued)

OTHER PUBLICATIONS

El Haj Moussa, G.W.; Ariswan; Khoury, A; Guastavino, F.; Llinares, C., Fabrication and study of photovoltaic material CuInxGa1-xSe2 bulk and thin films obtained by the technique of close-spaced vapor transport, Solid State Communications 122 (2002) 195-199.*
(Continued)

*Primary Examiner* — Keith Walker
*Assistant Examiner* — John A Hevey
(74) *Attorney, Agent, or Firm* — US Naval Research Laboratory; Rebecca L. Forman

(57) ABSTRACT

A method for forming a high purity, copper indium gallium selenide (CIGS) bulk material is disclosed. The method includes sealing precursor materials for forming the bulk material in a reaction vessel. The precursor materials include copper, at least one chalcogen selected from selenium, sulfur, and tellurium, and at least one element from group IIIA of the periodic table, which may be selected from gallium, indium, and aluminum. The sealed reaction vessel is heated to a temperature at which the precursor materials react to form the bulk material. The bulk material is cooled in the vessel to a temperature below the solidification temperature of the bulk material and opened to release the formed bulk material. A sputtering target formed by the method can have an oxygen content of 10 ppm by weight, or less.

16 Claims, 7 Drawing Sheets

(51) Int. Cl.
| | |
|---|---|
| *H01L 31/0368* | (2006.01) |
| *H01L 31/0392* | (2006.01) |
| *C23C 14/06* | (2006.01) |
| *C23C 14/08* | (2006.01) |
| *C23C 14/34* | (2006.01) |
| *H01J 37/34* | (2006.01) |

(52) U.S. Cl.
CPC ...... *C23C 14/3414* (2013.01); *C23C 14/3464* (2013.01); *H01J 37/3414* (2013.01); *H01L 21/02568* (2013.01); *H01L 21/02631* (2013.01); *H01L 31/0368* (2013.01); *H01L 31/03923* (2013.01); *H01L 31/18* (2013.01); *Y02E 10/541* (2013.01)

(58) Field of Classification Search
CPC ........... H01L 21/02631; C23C 14/0623; C23C 14/3464; Y02E 10/541
USPC ....... 148/553; 438/84, 85, 95; 136/262, 264, 136/265
See application file for complete search history.

(56) References Cited

U.S. PATENT DOCUMENTS

| | | | | |
|---|---|---|---|---|
| 5,096,518 | A * | 3/1992 | Fujikawa | B22F 3/1258 156/89.28 |
| 5,985,207 | A * | 11/1999 | Vawter | B22F 3/1283 419/25 |
| 6,713,391 | B2 * | 3/2004 | Yi | B22F 3/23 257/E21.169 |
| 2008/0302418 | A1 * | 12/2008 | Buller | H01L 31/02168 136/259 |
| 2009/0098717 | A1 | 4/2009 | Li et al. | |
| 2009/0148598 | A1 * | 6/2009 | Zolla | C23C 14/0623 427/251 |
| 2009/0250722 | A1 | 10/2009 | Bruce et al. | |
| 2010/0159633 | A1 | 6/2010 | Lee et al. | |

OTHER PUBLICATIONS

Heske, C. et al, Self-limitation of Na content at the CdS/ Cu(In,Ga)Se2 solar cell heterojunction, Thin Solid Films 361-362 (2000) 360-363.*

J. Chen, M. A. Gharghouri, and C. V. Hyatt; Effects of Growth Rate and Composition on the Microstructure of Directionally Solidified NiMnGa Alloys, Smart Structures and Materials 2003: Active Materials: Behavior and Mechanics, Dimitris C. Lagoudas, Editor, Proceedings of SPIE vol. 5053 (2003), pp. 181-190.*

P. Andonov, P. Dervin and C. Esling; Texture analysis of silicon with an heterogeneous morphology used for the photovoltaic conversion by neutron diffraction, Revue Phys. Appl. 22 (1987) 603-612.*

N. Srisukhumbowornchai and S. Guruswamy; Large magnetostriction in directionally solidified FeGa and FeGaAl alloys,J. Appl. Phys. 90, 5680 (2001); http://dx.doi.org/10.1063/1.1412840 (only abstract is provided).*

Suryanarayana et al., "Synthesis and processing of a Cu—In—Ga—Se sputtering target," Thin Solid Films 332 (1998) 340-344.*

Carmalt et al, "Solid-state and solution phase metathetical synthesis of copper indium chalcogenides," J. Mater. Chem., 1998 8(10), pp. 2209-2211. (Year: 1998).*

I Repins, M. A. Contreras, B. Egaas, C. DeHart, J. Scharf, C. L. Perkins, B. To, R. Noufi, "19.9%-efficient ZnO/CdS/CuInGaSe2 solar cell with 81.2% fill factor," Progress in Photovoltaics: *Research and Appl.*, 16, 235-239 (2008).

M. A. Green, K. Emery, D. L. King, Y. Hishikawa, W. Warta, Prog. Photovolt. Res. Appl. 15, 35 (2007).

Report on the Basic Energy Sciences Workshop on Solar Energy Utilization, US Dept. of Energy, Apr. 18-21, 2005. http://www.sc.doe.gov/bes/reports/files/SEU_rpt.pdf (accessed Jul. 2008).

J. D. Beach, B. E. McCandless, Mater. Res. Bull. 32, 225 (2007).

M. A. Contreras, K. Ramanathan, J. AbuShama, F. Hasoon, D. L. Young, B. Egaas, and R. Noufi, Pro. Photovolt. Res. Appl. 13, 209-216 (2005).

J. R. Tuttle, M. A. Contreras, K. R. Ramanathan, S. E. Asher, B. Bhattacharya, T. A. Berens, J. Keane, R. Noufi, NREL/SNL Photovoltaics Program Review, Nov. 1996, in: C. E. Witt, M. Al-Jassim, J.M. Gee (Eds.), AIP Conference Proceedings 394. American Institute of Physics, Woodbury, NY, 1997, p. 83.

B. M. Basol: "Preparation techniques for thin film solar cell materials: processing perspectives," Jph. J. Appl. Phys. 32, 35 (1993).

E. Niemi and L. Stolt, "Characterization of CuInSe2 thin films by XPS," Surface and Interface Analysis 15, 422-426 (1990).

G. Norsworthy, C. R. Leidholm, A. Halani, V. K. Kapur, R. Roe, B. M. Basol, R. Matson, "CIS film growth by metallic ink coating and selenization," Solar Energy Materials & Solar Cells 60, 127-134 (2000).

D. B. Mitzi, M. Yuan, W. Liu, A. J. Kellock, S. J. Chey, V. Deline, and A. G. Schrott, "A high-efficiency solution-deposited thin-film photovoltaic device," Adv. Mater. 20, 3657-3662 (2008).

V. Probst, W. Stettet, W. Reidl, H. Vogt, M. Wendl, H. Calwer, S. Zweigart, K.-D. Ufert, H. Cerva, and F.H. Karg, "Rapid CIS-process for high efficiency PV-modules: development towards large area processing," *Thin Solid Films*, 387, 262-267 (2001).

M. Gloeckler, J.R. Sites, "Band-gap grading in Cu(In,Ga)Se$_2$ solar cells," Journal of Physics and Chemistry of Solids, 66, 1891-1894 (2005.

* cited by examiner

SYNTHESIS OF HIGH-PURITY BULK COPPER INDIUM GALLIUM SELENIDE MATERIALS

This application claims the benefit of U.S. Provisional Application Ser. No. 61/245,400, filed Sep. 24, 2009, entitled Thin Film $Cu(In_{1-x}Ga_x)Se_2$ ($0 \leq x \leq 1$) with Composition Controlled by Co-Sputtering, by Jesse A Frantz, et al., and U.S. Provisional Application Ser. No. 61/245,402, filed Sep. 24, 2009, entitled Low Temperature and High Temperature Synthesis of High-Purity Bulk $Cu(In_{1-x}Ga_x)Se_2$ ($0 \leq x \leq 1$) Materials, by Vinh Q. Nguyen, et al., the disclosures of which are incorporated herein in their entireties, by reference.

CROSS REFERENCE

Cross reference is made to copending application Ser. No. 12/884,524, filed Sep. 17, 2010, entitled COPPER INDIUM GALLIUM SELENIDE (CIGS) THIN FILMS WITH COMPOSITION CONTROLLED BY CO-SPUTTERING, by Jesse A Frantz, et al., the disclosure of which is incorporated herein by reference in its entirety.

BACKGROUND

The present exemplary embodiment relates to a method for forming bulk copper-indium-gallium selenide (CIGS)-type materials. It finds particular application in conjunction with the formation of targets to be used for sputtering of semiconductor thin-films suitable for use in photovoltaic solar cells and other devices, and will be described with particular reference thereto. However, it is to be appreciated that the present exemplary embodiment is also amenable to other like applications.

Photovoltaic devices represent one of the major sources of environmentally clean and renewable energy. They are frequently used to convert solar energy into electrical energy. Typically, a photovoltaic device is made of a semiconducting junction with p-type and n-type regions. The conversion efficiency of solar power into electricity of such devices is limited to a maximum of about 30%, since photon energy in excess of the semiconductor's bandgap is wasted as heat and photons with energies smaller than the bandgap do not generate electron-hole pairs. The commercialization of photovoltaic devices depends on technological advances that lead to higher efficiencies, lower cost, and stability of such devices.

The cost of electricity can be significantly reduced by using solar modules constructed from inexpensive thin-film semiconductors. Thin films of polycrystalline copper indium gallium selenide of the form $Cu(In_{1-x}Ga_x)Se_2$, $0 \leq x \leq 1$ (CIGS), have shown promise for applications in thin film photovoltaics. The band gaps of these materials range from approximately 1.1 to 1.7 eV (see, J. L. Shay and J. H. Wernick, "Ternary Chalcopyrite Semiconductors Growth, Electronic Properties and Applications," Pergamon, New York (1975)). This should allow efficient absorption of solar radiation. A solar cell with an efficiency of 19.9%, measured with AM1.5 illumination, has recently been demonstrated by Repins, et al. (I. Repins, et al., "19.9%-efficient ZnO/CdS/CuInGaSe$_2$ solar cell with 81.2% fill factor," Progress in Photovoltaics: *Research and Appl.*, 16, 235-239 (2008)). See also, K. W. Mitchell, Proc. $9^{th}$ E. C. Photovoltaic Solar Energy Conference, Freiburg, FRG, September 1989, p. 292. Kluwer, Dordecht (1989); M. A. Green, et al., *Prog. Photovolt. Res. Appl.* 15, 35 (2007); Report on the Basic Energy Sciences Workshop on Solar Energy Utilization, US Dept. of Energy, Apr. 18-21, 2005; J. D. Beach, B. E. McCandless, *Mater. Res. Bull.* 32, 225 (2007); and M. A. Contreras, et al., *Prog. Photovolt. Res. Appl.* 13, 209-216 (2005).

CIGS films have been vacuum deposited by several different methods. These include evaporation (see, Repins, et al.), two-stage processes utilizing evaporated or sputter deposited precursors followed by selenization in $H_2Se$ (B. M. Basol, "Preparation techniques for thin film solar cell materials: processing perspectives," *Jph. J. Appl. Phys.* 32, 35 (1993); and E. Niemi and L. Stolt, "Characterization of $CuInSe_2$ thin films by XPS," *Surface and Interface Analysis* 15, 422-426 (1990)), metallic ink coating (G. Norsworthy, et al., "CIS film growth by metallic ink coating and selenization," Solar Energy Materials & Solar Cells 60, 127-134 (2000)), and coating via soluble hydrazine-based precursors (D. B. Mitzi, et al., "A high-efficiency solution-deposited thin-film photovoltaic device," *Adv. Mater.* 20, 3657-3662 (2008)).

While such techniques have produced efficient devices in the laboratory, CIGS deposition technologies that are scalable to large-area devices for commercial applications are desired. Sputtering from bulk CIGS is one example of a deposition technology that could be used to produce large area CIGS devices. However, there is currently no effective method for bulk production of CIGS materials. Currently, sputtering targets are formed by grinding CIGS precursor materials and compressing them into a target. Such methods tend to introduce impurities from the grinding process. There remains a need for methods for production of high quality CIGS in bulk which can be utilized in such large-scale deposition applications.

BRIEF DESCRIPTION

In accordance with one aspect of the exemplary embodiment, a method includes sealing precursor materials for forming a bulk crystalline material in a reaction vessel. The precursor materials include copper, at least one chalcogen selected from selenium, sulfur, and tellurium, and at least one group IIIA element selected from gallium, indium, and aluminum. The sealed reaction vessel is heated to a temperature at which the precursor materials react to form the bulk material. At a temperature below the solidification temperature of the bulk material, the reaction vessel is opened and the formed bulk crystalline material is removed.

In accordance with another aspect of the exemplary embodiment, a sputtering target of bulk CIGS material having an oxygen content of less than 10 ppm by weight.

In accordance with another aspect of the exemplary embodiment, a method for forming a sputtering target includes, in a reaction vessel, combining precursor materials for forming a bulk copper indium gallium selenide (CIGS) material, the precursor materials consisting essentially of copper, at least one chalcogen selected from selenium, sulfur, and tellurium, and at least one group IIIA element selected from gallium, indium, and aluminum, with other elements as dopants being combined with the precursors in an amount of from 0-10 atomic % of the bulk CIGS material. Thereafter, the vessel is evacuated and hermetically sealed. The sealed reaction vessel is heated to a temperature at which the precursor materials react to form the bulk material. At a temperature below the solidification temperature of the bulk CIGS material, the reaction vessel is opened and solid, crystalline bulk material is removed. The bulk material has a shape of a sputtering target.

DETAILED DESCRIPTION

Figure 1:
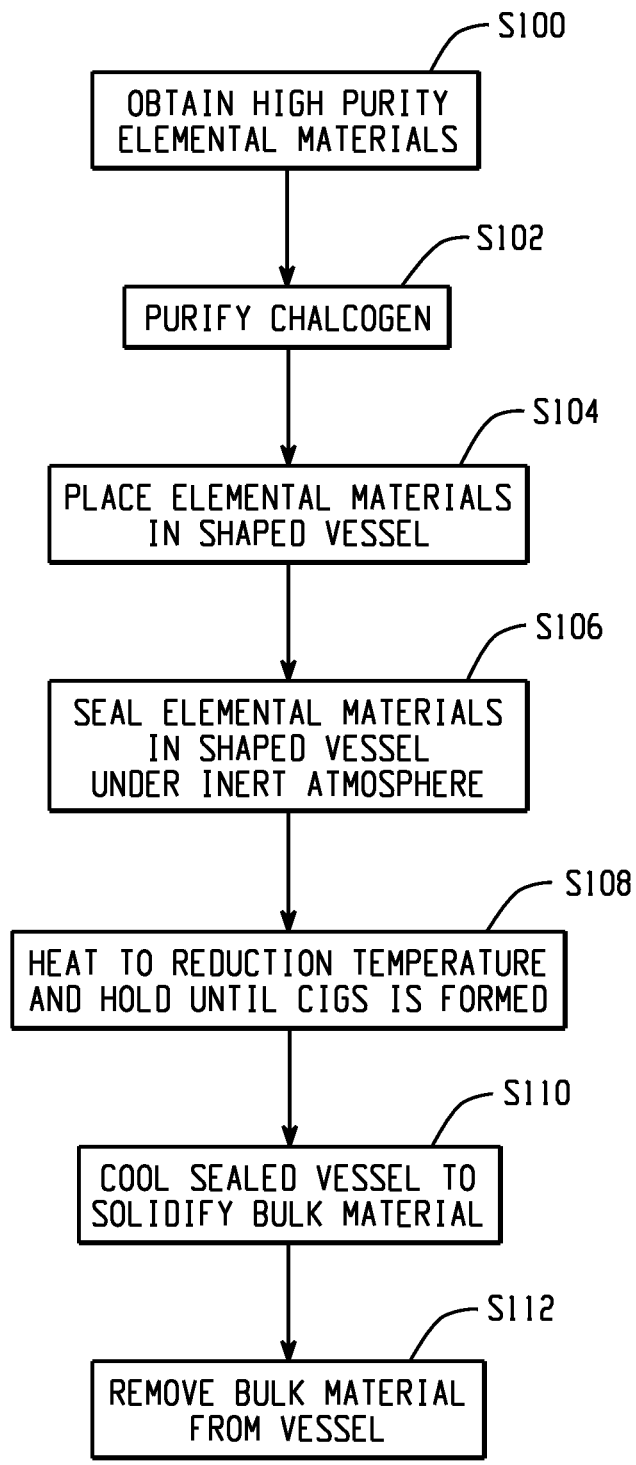
FIG. 1 is a flow diagram illustrating a method for forming bulk CIGS material in accordance with one aspect of the exemplary embodiment.

Aspects of the exemplary embodiment relate to a process for making high-purity bulk copper-indium-gallium-selenium (CIGS) material, and related polycrystalline compounds consisting essentially of copper, group IIIA metal, and chalcogen, and optionally one or more dopants, all of which will be referred to herein for convenience as CIGS material.

The CIGS material has a polycrystalline structure, in particular, a chalcopyrite crystalline structure, which is tetragonal. The CIGS bulk material may be doped with dopants such as Na, Li, Cr, Ni, and Ti, which can be used to tailor the optical and/or electronic properties of thin films formed by sputtering the exemplary bulk CIGS material. A low temperature and a high temperature route for preparation of the bulk CIGS material are disclosed.

The exemplary bulk crystalline CIGS material can have the general formula:

$Cu(In_{1-x}Ga_x)M_y$, where $0 \leq x \leq 1$, M represents a chalcogen selected from selenium (Se), sulfur (S), tellurium (Te), and combinations thereof, and y is approximately 2. The indium/gallium can be partially substituted with Al. In one embodiment, the chalcogen in the CIGS material is at least predominantly Se (i.e., >50 atomic % Se), and can be at least 95 atomic % Se and up to 100 atomic % Se. For convenience, the chalcogen may be referred to herein as selenium, bearing in mind that the other chalcogens, S and Te, may alternatively or additionally be present. While the bulk material can be stoichiometric (y=2), it is also contemplated that the proportions of the elements may be varied from the exact stoichiometric amounts without loss of the integrity and homogeneous dispersion of the elements in the bulk material. For example, Se can vary from 80-120% of its stoichiometric amount in the bulk material. In one embodiment, Se is at least 105% or at least 110% of the stoichiometric amount. An approximately stoichiometric formula can thus be represented by $Cu_a(Z)M_y$, where Z is selected from In, Ga, Al, and combinations thereof, $0.8 \leq a \leq 1$, and $1.6 \leq y \leq +2.4$. In one embodiment, a=1. In one embodiment, y>2, i.e., selenium is in excess of the stoichiometric amount, e.g., $y \geq 2.1$ and in one embodiment, $y \geq 2.2$. The CIGS bulk materials can contain dopants, such as one or more of Na, Li, Cr, Ni, and Ti, each at a concentration of from 0.001 to about 2 atomic % of the bulk material. The approximately stoichiometric bulk materials still have the CIGS crystalline structure, rather than different crystalline phases, but can have up to 1 in 5 vacancies, when copper is deficient, for example, and/or occasional sites occupied by dopant atoms.

The exemplary polycrystalline bulk material formed by the method is in the form of a monolith, i.e., a shaped block of the material, which is substantially homogeneous in composition. The monolith is particularly suited to use as a sputtering target. The composition of the CIGS material may be selected to provide a suitable bandgap for absorption of sunlight by a solar cell formed with a layer of the sputtered CIGS material. Tailoring of the bandgap can be achieved by adjusting the Ga:In ratio, the S:Se ratio, addition of dopants, and so forth. The S content can be from 0-100 atomic % of the chalcogen. The Te content can be from 0-50 atomic % of the chalcogen.

The exemplary method has several advantages over conventional processes. For example, it allows a large volume of high purity bulk material to be made for large scale commercialized applications, such as the preparation of targets which can be used for deposition of thin films by sputtering. The method can reduce processing time and energy requirements for forming bulk materials, particularly in the case of the high temperature method disclosed herein.

It has been found that conventional processes for forming sputtering targets result in the introduction of considerable amounts of oxygen to the target, particularly through the grinding process but also from the precursor materials themselves. The exemplary process is particularly suited to production of monoliths with extremely low oxygen content, e.g., of 10 ppm by weight, or less. In one embodiment, oxygen concentration is less than 1 ppm by weight.

Various techniques exist for measuring oxygen in the exemplary monolith, including inert gas fusion, energy dispersive X-ray analysis (EDAX), and Electron Spectroscopy for Chemical Analysis (ESCA, also known as XPS). Oxygen contents, as reported herein, are as measured by inert gas fusion with a LECO analyzer, available from LECO Corp., St. Joseph, Mich. The principle of operation is based on the fusion of a sample of the bulk material in a high purity graphite crucible in an inert carrier gas such as helium. A pre-weighed sample (e.g., 1 g of the bulk CIGS material) is placed in a loading chamber located above the graphite crucible in an electrode furnace. After a short purge cycle, electric current is passed through the crucible, heating it up to 3000° C. while the carrier gas is flowing in order to remove contaminants from the crucible. The crucible temperature is lowered by reducing the current and the sample is transferred to the hot crucible. The sample melts and any oxygen in the sample reacts with carbon from the crucible to form carbon monoxide and/or carbon dioxide. These gases are carried out of the furnace and the amounts determined using infrared detectors. Based on the results, the oxygen content of the sample is computed. This technique is capable of accurately determining oxygen contents of below 10 ppm by weight.

A process for forming the bulk material will now be briefly described with reference to FIG. 1. At S100, high purity elemental precursors for forming the CIGS bulk material are obtained. At S102, purification of selenium is performed. At S104, the elemental materials in divided form, but without grinding which could introduce oxygen, are placed in a frangible vessel of the desired shape of the bulk material in approximately stoichiometric amounts, optionally with one or more dopants present in a total amount of no more than 10 atomic % of the precursors and dopants combined. The vessel is then sealed (S106). The vessel is heated to a suitable reaction temperature in a furnace. In the heating, the reaction temperature maintained is either below (low temperature route) or above (high temperature route) a temperature range at which the mixture exhibits incongruent melting and the resulting CIGS material tends not to have a pure crystalline structure. The temperature is maintained for sufficient time for the CIGS material to form, which is dependent on the selected temperature (S108) and amount of material. The vessel is cooled to below the melting point of the CIGS material to solidify the CIGS material (S110). Thereafter, at S112, a monolith of solid bulk material in the desired shape is removed from the vessel, e.g., by breaking open the frangible vessel. In another embodiment, the vessel is designed so that it can be opened without breaking. The steps of the process are described in further detail below.

Figure 2:
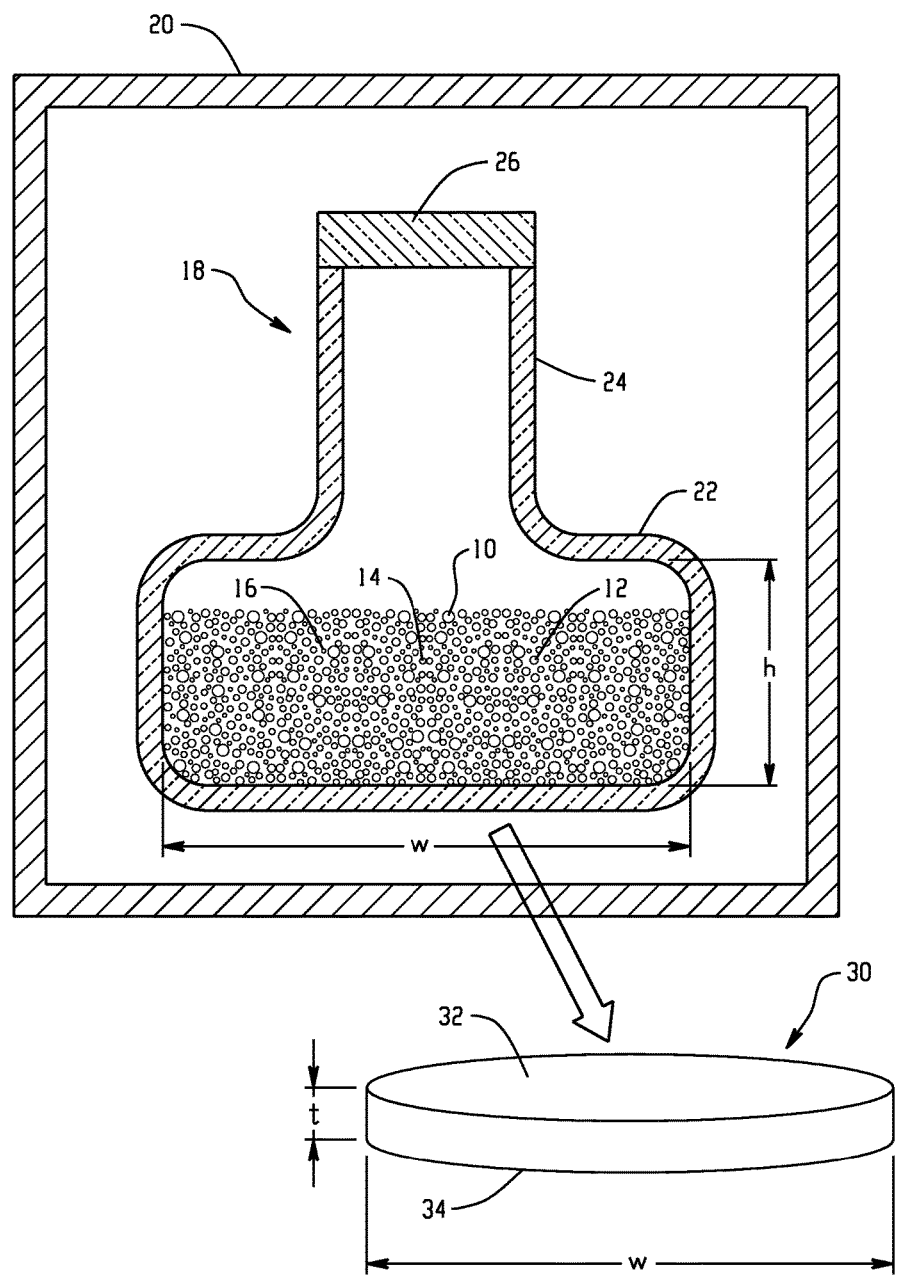
FIG. 2 is a schematic view of a sealed quartz ampoule containing a copper, gallium/indium, and selenium batch in a furnace and an illustrative target formed thereby.

FIG. 2 schematically illustrates the process. Particles 10, 12, 14, 16 of the elemental materials, copper, gallium and/or indium (optionally, replaced in part with some aluminum), and selenium, respectively, are shown placed in a reaction vessel 18 situated within a furnace 20 for heating. The vessel includes a base portion 22 and an inlet portion 24, through which the particles are introduced. The inlet portion is sealed with a seal 26, which may be formed by heating and crimping the inlet portion 24.

The vessel base portion 22 has an interior shape which is the desired shape of a bulk material monolith 30 to be formed. For example, where a cylindrical target 30 is being formed, the base portion has an interior width w (diameter) which is the same as that of the target 30 and a height h which is sufficient to accommodate the particulate elemental materials as well as the desired thickness t of the monolith. In general, h>t, such as h≥1.5t. The width w of the bulk material monolith 30, can be, for example, from about 0.5 cm to about 20 cm, e.g., about 5-15 cm. Its thickness t can be less than the width w and can be, for example, from 0.05-10 cm, e.g., about 0.2-0.5 cm. In the case of a target, both upper and lower surfaces 32, 34 are planar. The weight of the monolith 30 can be at least 0.5 grams, e.g., at least 1 gram or at least 10 grams. The weight can be at least 100 gm and can be up to 1000 grams, or higher. For example, an approximately 7.6 cm wide target may weigh about 130 grams.

The vessel 18 is formed from a frangible, refractory material, such as silica glass (fused quartz), which can withstand the reaction temperature (e.g., melts at 1300° C. or higher), without imparting impurities to the bulk material, while being breakable to release the formed bulk material monolith 30. As will be appreciated, many such monoliths 30 can be formed at the same time in a single furnace. For example, each monolith 30 may be formed in a separate reaction vessel 18. Alternatively, two or more monoliths could be formed in wells of a common vessel. Alternatively, one large monolith could be formed and cut into pieces with the desired dimensions.

For forming the monolith 30, elemental copper, gallium (and/or indium), selenium, and optionally dopants, are obtained of high purity, e.g., 99.99995% purity, in the case of Cu, Ga, and In (FIG. 1, S100). Commercially available selenium generally has trace amounts of oxygen, e.g., 100s or even tens of 1000's of ppm as well as other impurities. The oxygen content of these precursor materials can be reduced further through hydrogen gas reaction. The elemental material is heated in an inert atmosphere to at or above its melting point, or slightly below it, and a stream of hydrogen gas (high purity) is passed over it. The hydrogen reacts with the oxygen to form water, which is carried off as vapor.

Selenium may be further purified by a distillation process (S102). In the exemplary embodiment, this is performed by first heating high purity selenium (e.g., 99.9995% purity) inside a sealed and evacuated ampoule to a temperature above its melting point (which is about 217.8° C.) for several hours for oxide removal. Heating may be carried out, for example, at a temperature below the vaporization temperature, e.g., at about 250° C. This is followed by reloading the selenium into a distillation vessel for dynamic distillation at a higher temperature sufficient to remove chemi-adsorbed OH and $H_2O$ and then distill off the selenium as vapor (e.g., 400° C.). The distillate is removed during dynamic distillation and the high purity selenium is collected in a collection vessel, cooled down, and retrieved inside an inert nitrogen atmosphere glove box. The purified selenium is maintained in an inert atmosphere to avoid recontamination.

The elemental materials, copper, gallium/indium, and chalcogen, and any dopants are combined in particulate form, in suitable proportions for forming the desired bulk material, in the sealable vessel 18 (S104). In the exemplary embodiment, these are the only elements provided in the vessel which can be present in more than trace amounts. Any other element, which is present in a trace amount, is at no more than 50 ppm by weight of the bulk material. The particles 10, 12, 14, 16 need not be finely divided, thus avoiding contamination with oxygen and other impurities. For example, particles having an average size of about 0.001 to about 1 mm may be used, with at least 90% of the copper particles being less than 5 mm in size. Size can be measured as the particle's maximum dimension.

Figure 3:
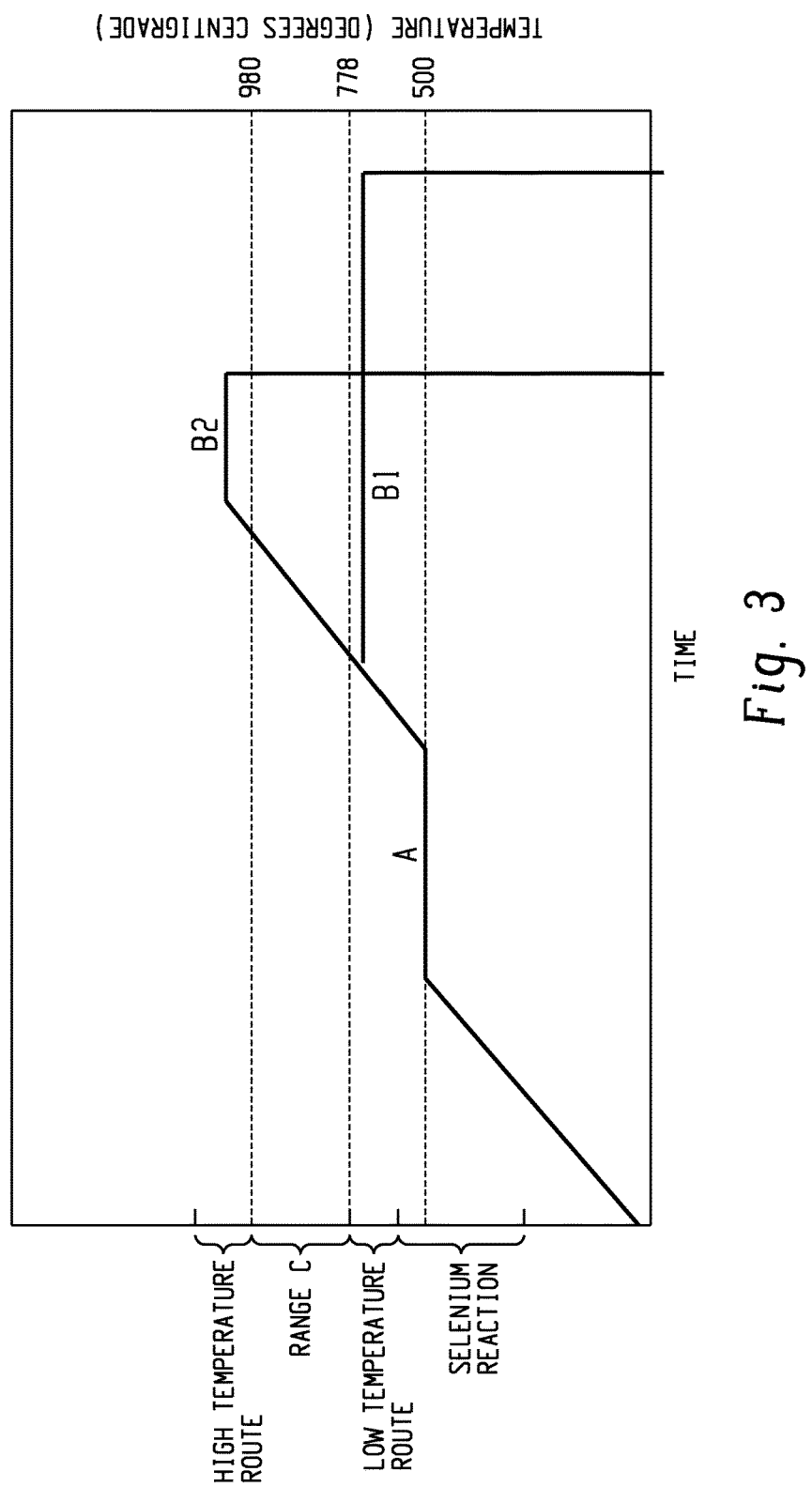
FIG. 3 illustrates temperature profiles for exemplary high and low temperature methods.

The vessel 18 containing the particles 10, 12, 14, 16 is placed in an inert atmosphere, such as argon or helium, where it is evacuated at low pressure (e.g., below $1 \times 10^{-4}$ Torr) and then sealed to provide a hermetically sealed vessel (S106). The sealing process prevents air from entering the vessel and vapor from escaping, during the subsequent reaction. The sealed vessel is placed in the furnace 20 and the temperature of the furnace ramped, e.g., at 5° C./min to a first soaking temperature A. Temperature A is sufficient to melt one or more of the non-chalcogen precursors, as well as the chalcogen. For example, selenium, indium and gallium are all molten at above about 220° C. A suitable temperature A is from about 300-600° C., e.g., about 500° C., as illustrated in FIG. 3. The soaking period is sufficient for at least some of the selenium liquid and/or vapor which forms through evaporation to react with one or more of the other molten elemental materials to form one or more selenides, such as gallium selenide, indium selenide, gallium indium selenide, and combinations of these. This selenization reaction avoids the vessel 18 shattering due to an increase in vapor pressure, which can occur if the temperature of the vessel is raised too quickly. In other embodiments, the vessel is sufficiently large to withstand the head pressure generated by the selenium vapor and the low temperature soak can be omitted.

After a soaking period of, for example, an hour or more, at the first soaking temperature A, the furnace temperature is ramped, more slowly, to a higher soaking temperature B1 or B2, e.g., at 2-3° C./min. The higher soaking temperature is selected to avoid a temperature range C in which the monolith 30 formed tends to have a poor crystalline structure due to incongruent melting (solid phases and liquid phases are present resulting in non-homogeneous phases). Range C can be, for example, from 778-980° C. The low temperature route uses a maximum temperature which is outside and below the range C, e.g., up to about 775 or 776° C. The high temperature route, while passing through range C, involves maintaining the temperature of the reactants at a temperature above the liquidus temperature (i.e., outside and above range C), e.g., by maintaining a temperature within the furnace of at least 982° C. or at least 1000° C., which achieves approximately the same temperature in the vessel. Since the reaction tends to proceed faster at higher temperatures, the soaking temperature B1 can be, for example, at least 700° C. for the low temperature route, e.g., above 750° C., and in one embodiment, at about 775° C. For the high temperature route, the higher soaking temperature is below the melting point of the vessel, e.g., up to about 1100° C. The furnace is maintained at the higher temperature B1 or B2 for sufficient time for the reaction of the elemental materials to form the selenide. Since copper may not reach its melting point during the heating step B1 or B2, the reaction can take several hours, or days in the case of the low temperature route, to reach completion. At 775° C., for example, the reaction takes at least two or three days to reach completion (all copper reacted and a homogeneous crystalline solid is formed). At above 980° C., (e.g. 981° C. and higher) the reaction may be complete in 1-3 hrs. The time required for forming the bulk product at a selected temperature can be determined through experimentation—e.g., by performing several reactions for different lengths of time, analyzing the product, e.g., by X-ray diffraction (XRD) and selecting a time sufficient to complete the reaction.

Thereafter, the temperature of the furnace is ramped down to room temperature, e.g., at a rate of 10° C./min, and the vessel 18 is retrieved from the furnace. Alternatively, the vessel 18 is simply removed from the furnace at the end of the high temperature soak and allowed to cool under ambient conditions. Forced air or water quenching may be used to speed up the cooling process.

On opening, the cooled vessel 18 under an inert atmosphere, e.g., by breaking the vessel, the highly pure CIGS material is retrieved as a monolith 30 and may be stored in an inert atmosphere until needed. While for convenience, the vessel is broken open at ambient temperature, it is to be appreciated that the vessel may be broken open at any suitable temperature at which the crystalline bulk CIGS material is solid, which can be somewhat above or below room temperature.

The thus-formed monolith 30 can be used as a target in a sputtering apparatus. In some embodiments, a target formed entirely or predominantly of chalcogen (e.g., >50% chalcogen) may be formed in a similar manner to that described for the CIGS material. For example, purified selenium is placed in a reaction vessel analogous to vessel 18. The vessel may then be evacuated and sealed and heated to a temperature above the melting point of the chalcogen. The vessel is cooled and the monolith of selenium is removed by breaking open the vessel. Optionally, a subsequent heat treatment is applied to control the degree of crystallinity and grain size.

Figure 4:
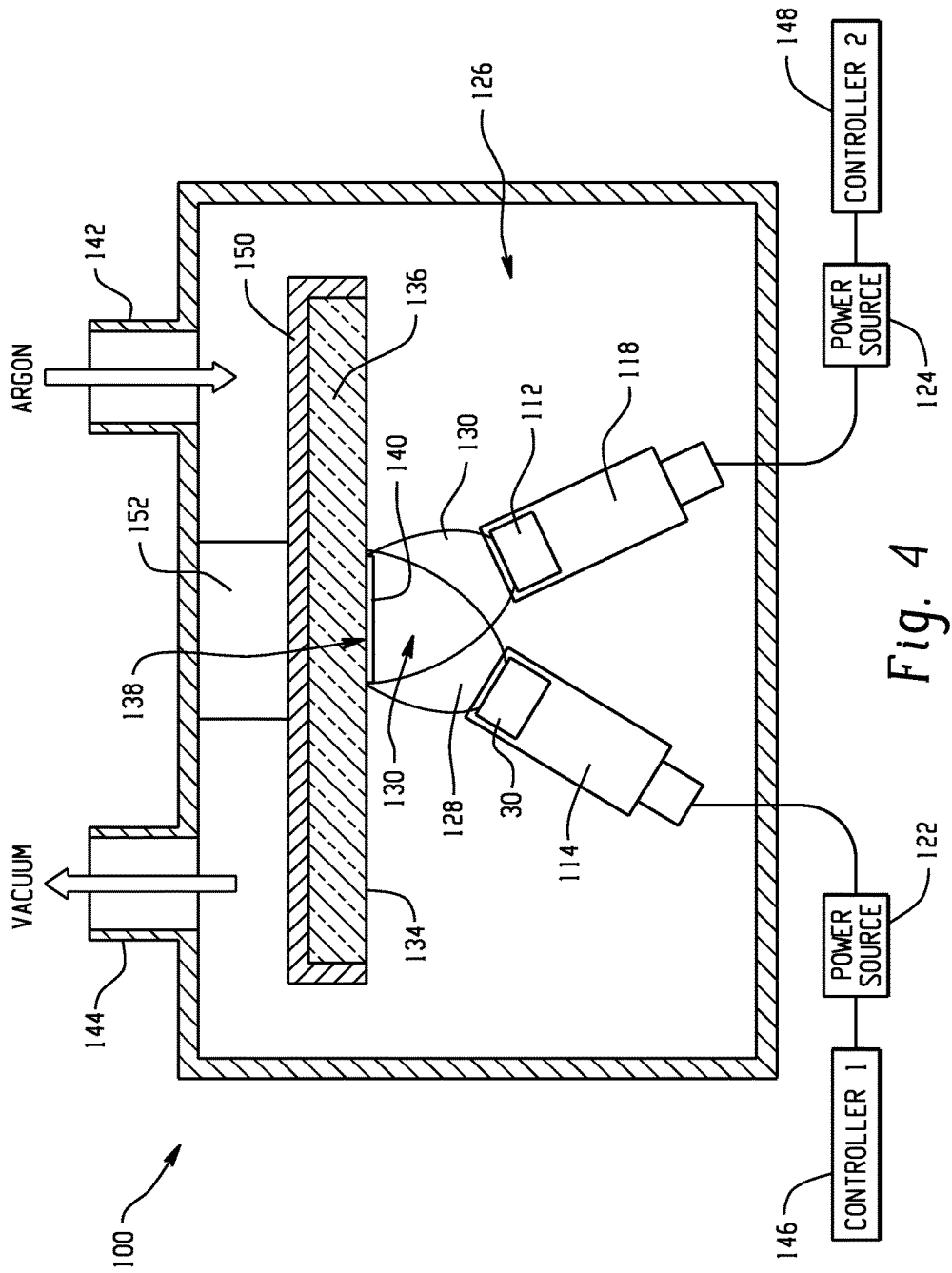
FIG. 4 is a schematic view of the exemplary target in a sputtering apparatus.

An exemplary sputtering apparatus 100 is illustrated in FIG. 4. The apparatus includes a target 30 comprising the bulk CIGS material. Since selenium (or other chalcogen) tends to evaporate off in the sputtering process, the target 30 may have been formed with a higher than stoichiometric amount of selenium, to compensate for the loss of selenium during sputtering. As a result, the selenium in the sputtered material is closer to a stoichiometric amount. In other embodiments, the apparatus 100 may be configured for co-sputtering target 30 and a separate target 112 comprising a chalcogen selected from selenium, sulfur, tellurium, and combinations thereof. This can result in the sputtered material being closer to stoichiometric than with the CIGS target alone. Target 30 and/or target 112 can have an oxygen concentration of 10 ppm by weight, or less. In one embodiment, target 30 has an oxygen content of 1 ppm, by weight, or less.

The sputtering apparatus 100 may be configured for any suitable sputtering method, such as RF, DC, or magnetron sputtering. In the illustrated embodiment, the target 30 may be mounted in a first sputter source 114 and the target 112 is mounted in a second sputter source 118. The targets may be powered by separate power sources 122, 124, respectively. The power sources supply an electric current to the targets to raise each target to a negative potential (cathode), causing material to be sputtered off into a surrounding plasma. The power sources 122, 124, can each be an RF power source, a DC power source, or an AC power source. An RF magnetron (not shown) or other electrode may be positioned adjacent the targets. The targets 30, 112 are arranged in a sputtering chamber 126 so that plumes 128, 130 of sputtered material are coincident in a region 132 of the chamber adjacent a surface 134 of a substrate 136. For example, the sputter sources are angled towards the same area 138 on the substrate 136, so that the plumes overlap in area 138, resulting in the deposition of a thin layer film 140 (not to scale) of CIGS material. The chamber 126 is provided with an inlet 142 for introducing an inert sputtering gas, such as argon at low pressure. The chamber is evacuated with a vacuum source (not shown) via an outlet 144. One or both of the exemplary power sources 122, 124 is/are variably adjustable by respective controllers 146, 148, for variably adjusting the power to each sputter source. In this way, the targets may be sputtered sequentially and/or the relative amounts of material sputtered from the targets may be adjusted during deposition of the film to vary the concentration of the target materials in the film 140. An electrically powered heater 150 variably adjusts the temperature of the substrate 136 to provide a suitable substrate surface temperature for deposition (e.g., e.g., at least about 250°, such as about 550° C.) and optionally to provide a suitable temperature for annealing the film for a period of time (e.g., about 400-600° C.). The substrate may be mounted for rotation on a substrate support 152. The support may be coupled to an RF power source, a DC power source, an AC power source, or to ground.

While FIG. 4 illustrates a sputter up configuration (targets positioned below the substrate), other configurations, such as sputter down, are also contemplated.

An exemplary method for forming the CIGS film 140 includes sputtering from target 30 comprising the CIGS source and, optionally, sputtering from target 112 comprising selenium or other chalcogen, in chamber 126 under vacuum with a slight argon gas pressure. The targets 30, 112, where both are present, may be sputtered sequentially and/or contemporaneously. In the case of sequential sputtering, the CIGS material may be formed by annealing sequentially-applied CIGS and selenium layers at a sufficient temperature for selenium to diffuse from the selenium layer(s) through the film to the CIGS layer(s), e.g., at about 400-600° C. Other methods for co-sputtering are disclosed in above-mentioned copending application Ser. No. 12/884,524 (issued U.S. Pat. No. 8,894,826), incorporated by reference.

Without intending to limit the scope of the exemplary embodiment, the following examples describe preparation of exemplary bulk CIGS materials.

EXAMPLES

Materials: High purity copper (99.99995%), indium (99.99995%), and gallium (99.99995%) obtained from Alpha Aesar were used.

High purity selenium (99.9995%) obtained from Alpha Aesar was further purified by heating at 240° C. for 6 hours in a sealed and evacuated ampoule for oxide removal, followed by dynamic distillation at 400° C. for 4 hours, as described above, to remove chemi-adsorped OH and $H_2O$.

Example 1: Preparation of Bulk $Cu_1Ga_1Se_2$ Material (x=0) at Low Temperature 21.8229 grams of copper, 23.9442 grams of gallium, and 54.2328 grams of selenium (approximately 100.00 grams in total) were batched in a cylindrical silica ampoule inside a nitrogen atmosphere glove box. The ampoule was about 27 cm in total length and about 3 cm in internal width of a base portion, with an inlet portion of a narrower width and a length of about 4.5 cm. The ampoule was evacuated for 4 hours at a pressure of $1\times10^{-5}$ Torr and then the inlet portion was sealed using a methane/oxygen torch.

The ampoule was placed in a furnace. The preparation schedule used for making 100 grams of bulk $Cu_1Ga_1Se_2$ is given in Table I. At the end of the preparation schedule, the ampoule was removed from the furnace at room temperature and broken open inside a glove box under a nitrogen atmosphere to retrieve the bulk $Cu_1Ga_1Se_2$ material.

TABLE I

Preparation schedule for low temperature route

| Step | Conditions |
|---|---|
| Ramp 1 | 5° C./min |
| Soak Temperature A | 500° C. |
| Soak Time at Temperature A | 10 hrs. |
| Ramp 2 | 3° C./min |
| Soak Temperature B1 | 775° C. |
| Soak Time at Temperature B1 | 72 hrs. |
| Ramp 3 | 10° C./min |
| Final Temperature Sample retrieve | 20° C. |

Figure 5:
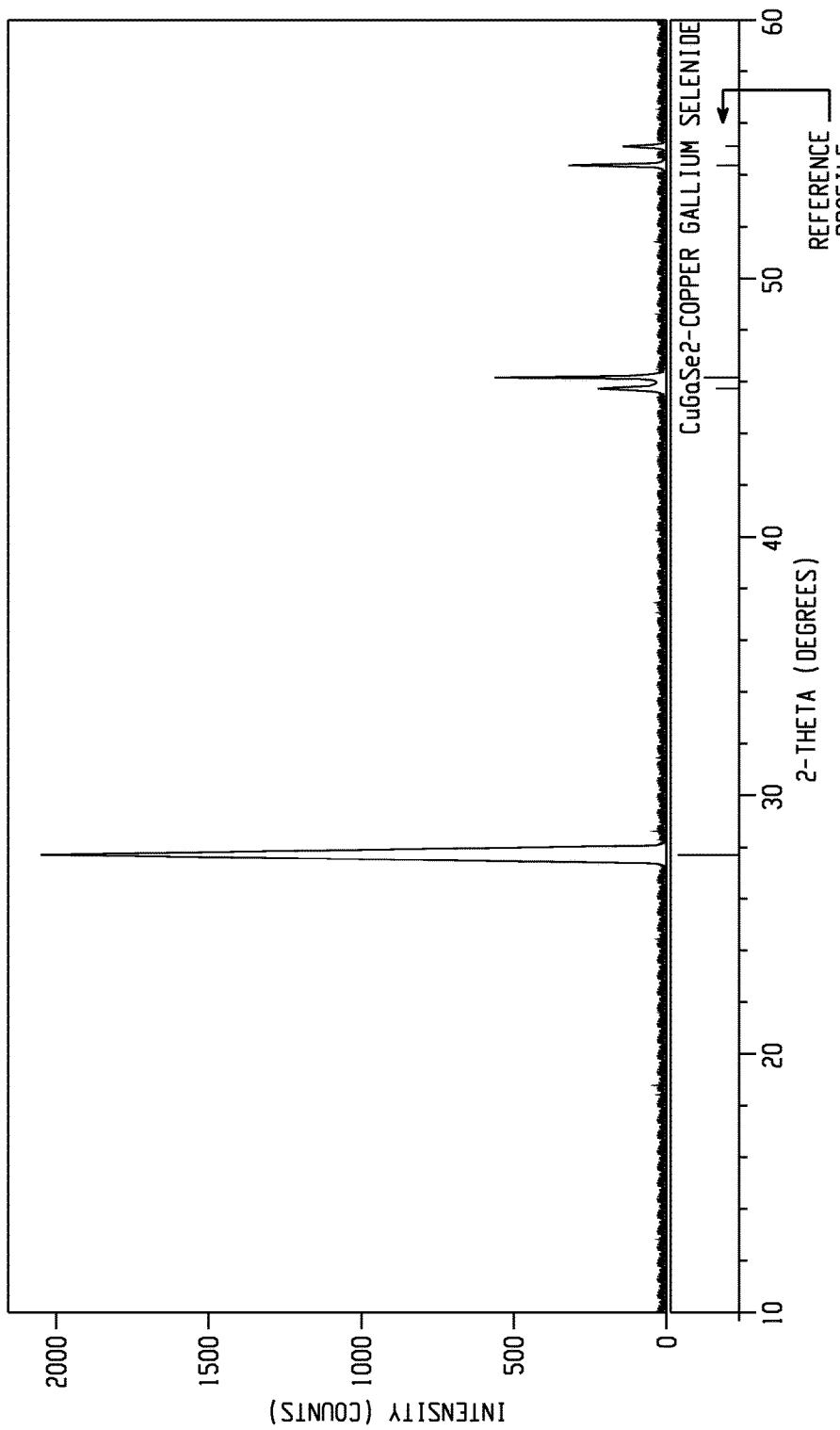
FIG. 5 is an X-ray diffraction plot of $Cu_1Ga_1Se_2$ made with the exemplary low temperature method.

FIG. 5 shows an X-ray diffraction plot of the low-temperature prepared $Cu_1Ga_1Se_2$ material above a reference profile, obtained from the literature. The X-ray pattern shows very high phase purity.

Example 2: Preparation of Bulk $Cu\ In_{0.7}Ga_{0.3}Se$ Material x=0.3 at Low Temperature 25.596 grams of copper, 32.373 grams of indium, 8.425 grams of gallium, and 63.606 grams of selenium (approximately 130.00 grams in total) were batched in a silica ampoule as for Example 1. The ampoule was evacuated for 5 hours at a pressure of $1\times10^{-5}$ Torr. The ampoule was sealed using a methane/oxygen torch and placed in a furnace, as for Example 1. The preparation schedule for preparing 130 grams of $Cu_1In_{0.7}Ga_{0.3}Se_2$ composition through the low temperature method was as shown in Table I. At the end of the preparation schedule, the ampoule was removed from the furnace at room temperature and broken open to retrieve the bulk $Cu_1In_{0.7}Ga_{0.3}Se_2$ material.

Figure 6:
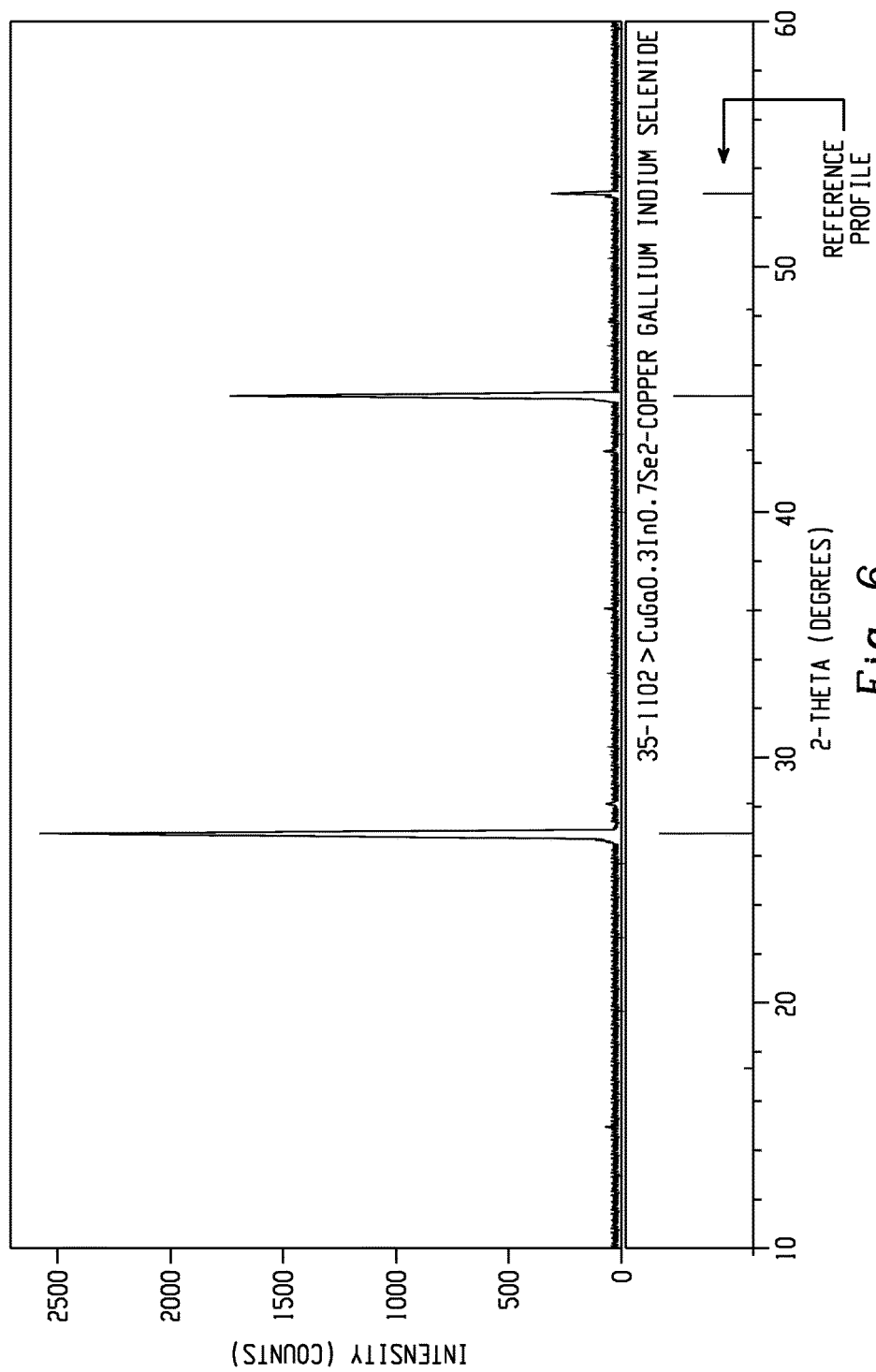
FIG. 6 is an X-ray diffraction plot of $Cu_1In_{0.7}Ga_{0.3}Se_2$ made with the exemplary low temperature method.

FIG. 6 shows an X-ray diffraction plot of the low-temperature prepared $Cu_1In_{0.7}Ga_{0.3}Se_2$ material above a reference profile. The X-ray pattern shows very high phase purity.

Example 3: Procedure to Make Bulk $Cu_1In_{0.7}Ga_{0.3}Se_2$ Material (x=0.3) at High Temperature 5.906 grams of copper, 7.474 grams of indium, 1.944 grams of gallium, and 14.678 grams of selenium (approximately 30.00 grams in total) were batched in a silica ampoule. The ampoule was evacuated for 5 hours at a pressure of $1\times10^{-5}$ Torr. The ampoule was then sealed using a methane/oxygen torch and placed in a furnace at a 45 degree angle. The preparation schedule used in making 100 grams of bulk $Cu_1Ga_1Se_2$ composition was as given in Table 2. (The same process may be used for making 130 grams of $Cu_1In_{0.7}Ga_{0.3}Se_2$ composition, using material quantities as given in Example 2.) At the end of the preparation schedule, the ampoule was removed from the furnace at room temperature and broken open to retrieve the bulk $Cu_1In_{0.7}Ga_{0.3}Se_2$ material.

TABLE 2

Preparation schedule for high temperature route

| Step | Conditions |
|---|---|
| Ramp 1 | 5° C./min |
| Soak Temperature A | 500° C. |
| Soak Time at Temperature A | 3 hrs. |
| Ramp 2 | 2° C./min |
| Soak Temperature B2 | 1000° C. |
| Soak Time at Temperature B2 | 1 hr. |
| Ramp 3 | −10° C./min |
| Final Temperature Sample retrieve | 20° C. |

Figure 7:
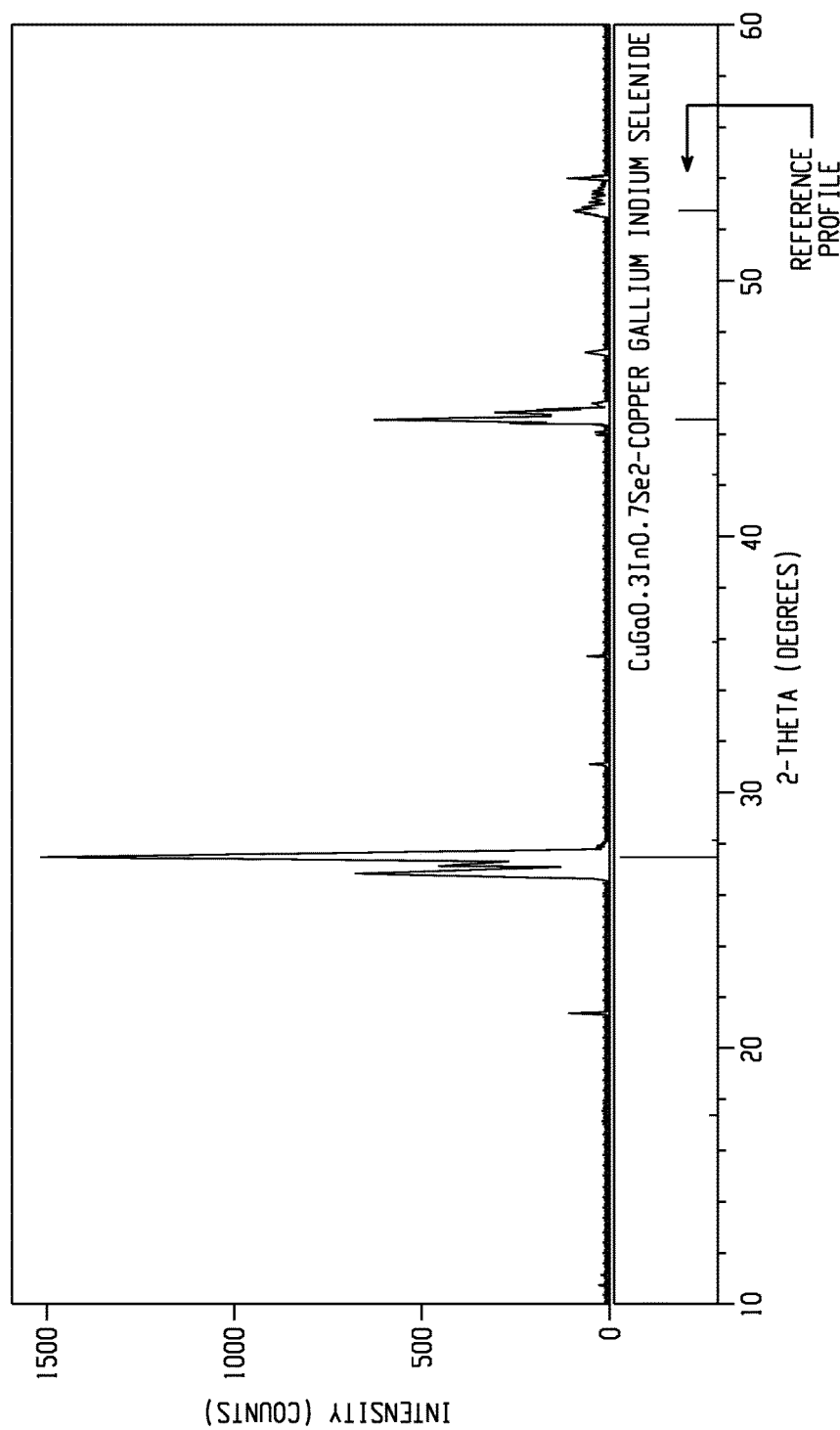
FIG. 7 is an X-ray diffraction plot of $Cu_1In_{0.7}Ga_{0.3}Se_2$ made with the exemplary high temperature method.

FIG. 7 shows an X-ray diffraction plot of high-temperature prepared $Cu_1In_{0.7}Ga_{0.3}Se_2$ material above a reference profile. The X-ray pattern shows very high phase purity.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:
1. A method comprising:
   sealing precursor materials for forming a bulk polycrystalline material in a reaction vessel, the precursor materials comprising copper, at least one chalcogen selected from selenium, sulfur, and tellurium, and at least one element selected from gallium, indium, and aluminum;
   heating the sealed reaction vessel to a temperature at which the precursor materials react to form the bulk material, wherein the heating is to a maximum temperature of 776° C., wherein the heating includes:
      ramping the temperature of the sealed vessel to a first soak temperature;
      maintaining the first soak temperature for a sufficient time for at least some chalcogen in at least one of liquid and vapor form to react with other precursor materials;
      ramping the temperature from the first soak temperature to a second soak temperature; and maintaining the second soak temperature for sufficient time to form the bulk material; and at a temperature at which the bulk material is solid, opening the reaction vessel and removing the formed bulk material.

2. The method of claim 1, wherein the sealing of the precursor materials comprises sealing the copper, chalcogen, and the at least one of gallium and indium in the vessel in their elemental form.

3. The method of claim 1, wherein the chalcogen is predominantly selenium.

4. The method of claim 1, wherein the bulk material has a general formula $Cu_a(Z)M_{2+b}$, where Z is selected from In, Ga, Al, and combinations thereof, M is selected from Se, S, Te, and combinations thereof, $0.9 \leq a \leq 1.1$, and $-0.4 \leq b \leq +0.4$.

5. The method of claim 1, wherein the bulk material includes chalcogen in excess of a stoichiometric amount.

6. The method of claim 1, further comprising, prior to the sealing, purifying the chalcogen to reduce a concentration of oxygen impurities.

7. The method of claim 1, wherein the second soak temperature is in a temperature range of 700° C. to 775° C.

8. The method of claim 1, wherein the method further includes combining a dopant with the precursor materials, the dopant being selected from Na, Li, Cr, Ni, Ti, and combinations thereof.

9. The method of claim 8, wherein the dopant is present at no more than 10 atomic % of the precursor materials and dopant in the vessel.

10. The method of claim 1, wherein the sealing includes evacuating the vessel containing the precursor materials prior to sealing the vessel.

11. The method of claim 1, wherein the reaction vessel is formed from a refractory material having a melting point of at least 1300° C.

12. The method of claim 11, wherein the refractory material comprises silica.

13. The method of claim 1, wherein the reaction vessel includes an interior width of at least 5 cm.

14. The method of claim 1, wherein the bulk material comprises a monolith.

15. The method of claim 14, wherein the monolith is cylindrical.

16. The method of claim 1, further comprising sputtering the bulk material onto a substrate to form a semiconductor thin film.

* * * * *